June 30, 1953 A. T. NORDSIECK 2,644,106

TUNING AND STRAPPING MECHANISM FOR MAGNETRONS

Filed April 30, 1946 2 Sheets-Sheet 1

INVENTOR.
ARNOLD T. NORDSIECK
BY
William D. Hall.
ATTORNEY

TUNING AND STRAPPING MECHANISM FOR MAGNETRONS

Filed April 30, 1946 2 Sheets-Sheet 2

INVENTOR.
ARNOLD T. NORDSIECK
BY William D. Hall
ATTORNEY

Patented June 30, 1953 2,644,106

UNITED STATES PATENT OFFICE 2,644,106

TUNING AND STRAPPING MECHANISM FOR MAGNETRONS

Arnold T. Nordsieck, New York, N. Y., assignor to the United States of America as represented by the Secretary of War Application April 30, 1946, Serial No. 666,000

11 Claims. (Cl. 315—40)

This invention relates to ultra-high frequency generators of multi-cavity magnetron type in which ultra high frequency oscillations are generated by a number of resonators set into oscillations by high velocity electrons moving along curvilinear or orbital paths, these paths being followed by the electrons because of the joint action of the static and radio frequency electromagnetic fields.

More particularly the invention relates to a tuning system for magnetrons, the tuning of the resonant circuits of the magnetron being obtained by varying the distributed capacitance of the resonating circuits. The disclosed tuning system is so constructed that it performs a dual function, one of tuning a magnetron, and another of acting as a strapping means for the magnetron resonators to obtain more favorable mode separations and stability of operation in the selected mode.

It is therefore an object of this invention to provide positive means for adjusting the frequency of ultra high frequency magnetrons.

An additional object of this invention is to provide tuning means for a magnetron in which the fraction of tunable capacitance is large, as compared to fixed capacitances of the resonating circuits, giving large tuning range.

Another object of this invention is to provide a tunable magnetron in which tuning is accomplished by varying the capacitance of the resonating circuits in such a manner as to offer a high rate of tuning of the operating mode in comparison with the tuning rates of the other modes.

Still another object of this invention is to provide tuning instrumentalities for a magnetron, these instrumentalities being designed so as to be suitable not only with low frequency magnetrons, but also with the magnetrons of ultra-high frequencies.

It is also an object of this invention to provide novel strapping means for multiresonator magnetrons, the disclosed strapping having electrical and mechanical advantages over the known strapping arrangements; it is much simpler mechanically, and therefore can be applied to the ultra-high frequency magnetrons, and it produces "tighter" or a more effective electrical strapping of the anode segments, and, moreover, it introduces lower electrical losses than the known schemes.

Still another object of this invention is to provide a tunable magnetron in which tuning and strapping is accomplished by means of a single variable condenser composed of two metallic discs mounted in an end space of the magnetron structure, the discs being provided with a plurality of tabs, the tabs of one disc being connected to alternate anode segments, while the tabs of the other disc are connected to the remaining segments, thereby increasing the capacitance of the resonators by an amount equal to the variable capacitance between the two discs, which in turn, produces large tuning range.

Still another object of this invention is to provide a tunable magnetron in which tuning is accomplished by two tuning discs, one disc electrically interconnecting alternate anode segments and being fixed in its position with respect to the anode, while the other disc electrically interconnecting the remaining segments and being adjustable with respect to the fixed disc, the fixed disc being mounted in the vertical extension of the anode, while the adjustable disc is mounted in spaced relationship above the fixed disc, this adjustable disc being provided with mechanical instrumentalities for adjusting its spacing relative to the fixed disc for varying the capacitance of the resonating circuits of the magnetron, thereby varying the operating frequency of magnetron, the electrical connections between the discs and the respective segments enabling these discs also to act as the anode strapping structure.

The additional objects of this invention are the provision of tuning instrumentalities for magnetrons which have reasonably long life of all movable parts, reproducibility and stability of the desired frequency, and a reasonable weight of the entire combination so that a tunable magnetron does not weigh appreciably more than the fixed frequency magnetrons.

The invention may be considered as an improvement of the tuning systems disclosed in the co-pending application of Simon Sonkin on "Tunable Magnetron," S. N. 623,422 filed October 19, 1945, and especially on the tuning system disclosed in Fig. 1 of the above application, where tuning is accomplished by a metallic disc supported above one anode-end-surface in one of the end spaces of the magnetron. The disc is connected to mechanical instrumentalities, which either lower or raise this disc with respect to the anode for varying the distributed capacitances of the resonating circuits. The improvements, of which there are several, reside in increasing the tuning range of the magnetron by increasing the fraction of tunable capacity, and by arranging this tunable capacity so that varying of the latter favors high rate of tuning of the operating mode in comparison with the tuning rates of all other modes. Moreover, as stated previously, the tuning instrumentalities are so arranged that they are used for tuning as well as for positively strapping of the anode segments.

The invention discloses novel configuration and electrical connections of the capacitively tuned elements, which avoid the limitations typical of the capacitive tuning systems known to the art. Thus, as mentioned previously, the disclosed system increases to a very large extent the fraction of tunable capacitances, thus giving larger tuning range, and the disclosed tuning instrumentalities inherently offer a high rate of tuning of the operating mode in comparison with the tuning rates of other modes, which obviously, increases the frequency stability of the entire system. In addition, the electrical connections of the tuning elements are such that they also perform a valuable strapping function in a manner superior to the same function performed by the known strapping means.

These and other features of the invention will be more clearly understood from the following description and the accompanying drawings, in which.

Figures 1, 2:
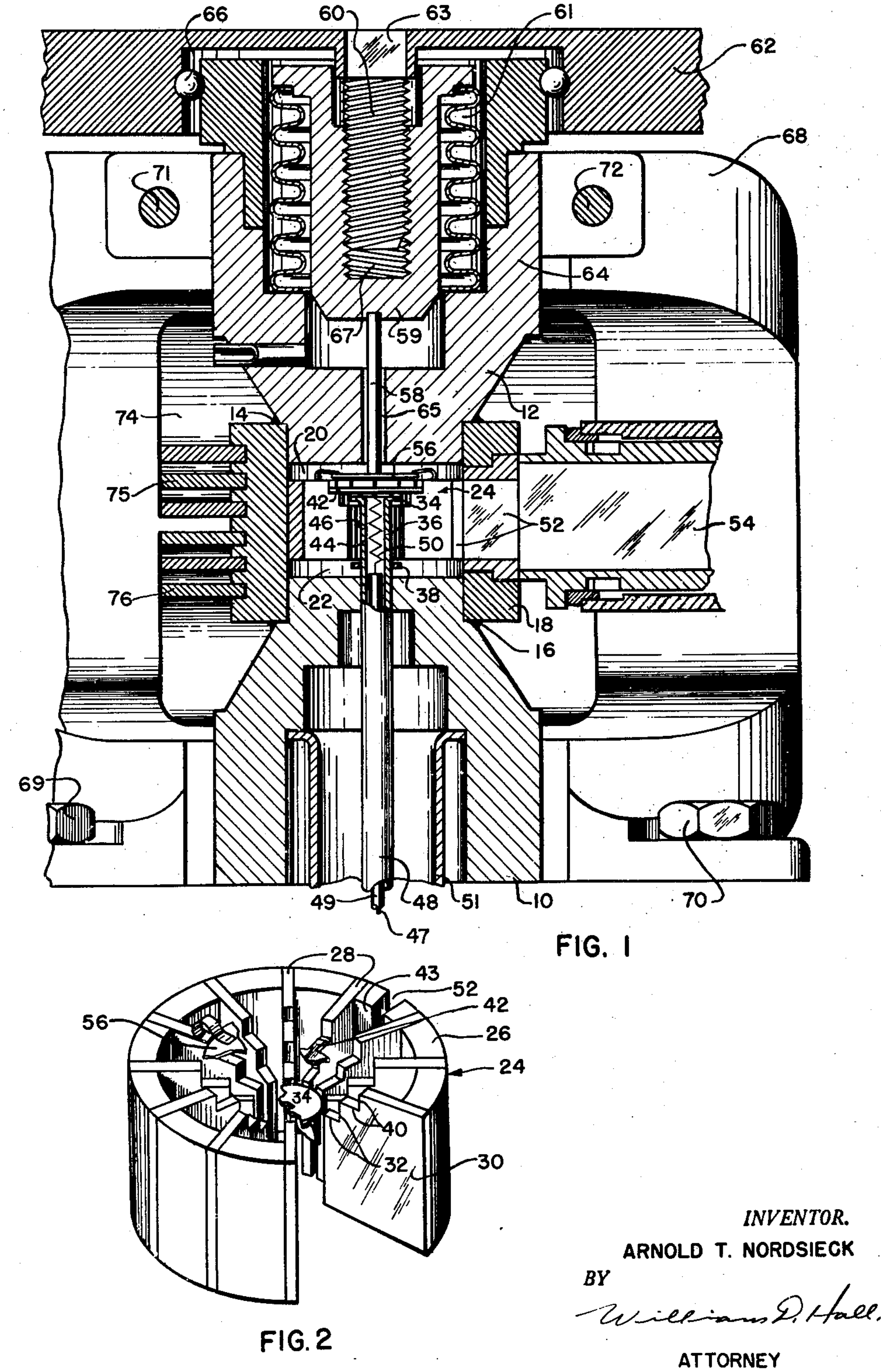
Figure 1 is an axial sectional view of a tunable magnetron, using one stationary and one movable tuning disc electrically connected to the segments of the anode, the movement of one disc with respect to the other performing the aforementioned tuning function.
Figure 2 is a fragmentary, enlarged perspective view of a vane-type anode and of the tuning discs connected to the anode.

Referring to Fig. 1 there is illustrated by the way of an example a tunable, strapped, vane-type magnetron having 12 resonating circuits, as illustrated more clearly in Fig. 2. The mounting plate and the lower portion of the cathode structure are not illustrated in any of the figures, since they are well known in the art and do not represent a part of this invention. The illustrated structure includes ferromagnetic pole-pieces 10 and 12, which are brazed at junctions 14 and 16 to a copper magnetron shell 18, the shell and the pole-pieces being so proportioned that two end spaces 20 and 22 exist between the inner ends of the pole-pieces and the upper and lower surfaces of a twelve-vane anode 24. The construction of the anode is illustrated on an enlarged scale in Fig. 2; the anode consists of a copper ring 26 and twelve vanes 28, the upper inner corner of each vane having a stepped configuration, as illustrated more clearly in the side view of vane 30 in Fig. 2. The lower step 32 is used for enlarging the clearance between the anode and the upper hat 34, Fig. 1, of an indirectly heated and centrally mounted cylindrical cathode 36, the lower hat 38 of the same cathode being placed in the lower end space 22 of the magnetron. Cathode 36 consists of an indirectly heated nickel cylinder, the outer surface of which is provided with an oxide retaining screen 44, which is used as an anchoring device for an outside electron-emitting oxide coating 46 of the cathode. The cathode structure is of axial type, that is, the axis of the cathode cylinder coincides with the axis of the anode and of the pole-pieces, and it is supported by a concentric line including an outer conductor 48 and an inner conductor 47, the latter being insulated by a glass bead 49. The heating element of the cathode is illustrated at 50. The lower end of the heater element is connected to conductor 47, while the upper end is connected to the cathode cylinder 36, which completes the circuit of the heater. The concentric line of the heater is supported by a conventional reentrant glass seal, not illustrated in the drawing, which is connected by an eyelet 51. The eyelet forms a gas-tight joint with the cathode pole-piece 10 of the magnetron. For a more detailed description of the cathode structures of this type, reference is made to the previously mentioned application for patent of Simon Sonkin.

As illustrated more clearly in Fig. 2, the resonating cavity 43 of the anode is connected through an impedance matching wave guide transformer 52 to a wave guide output circuit 54. For a more detailed description of the wave guide output circuits for the U. H. F. magnetrons, reference is made to the application for patent of Sidney Millman, entitled "Wave Guide Output Circuit," filed March 11, 1946, S. N. 653,514.

Figures 3, 4, 5, 6:
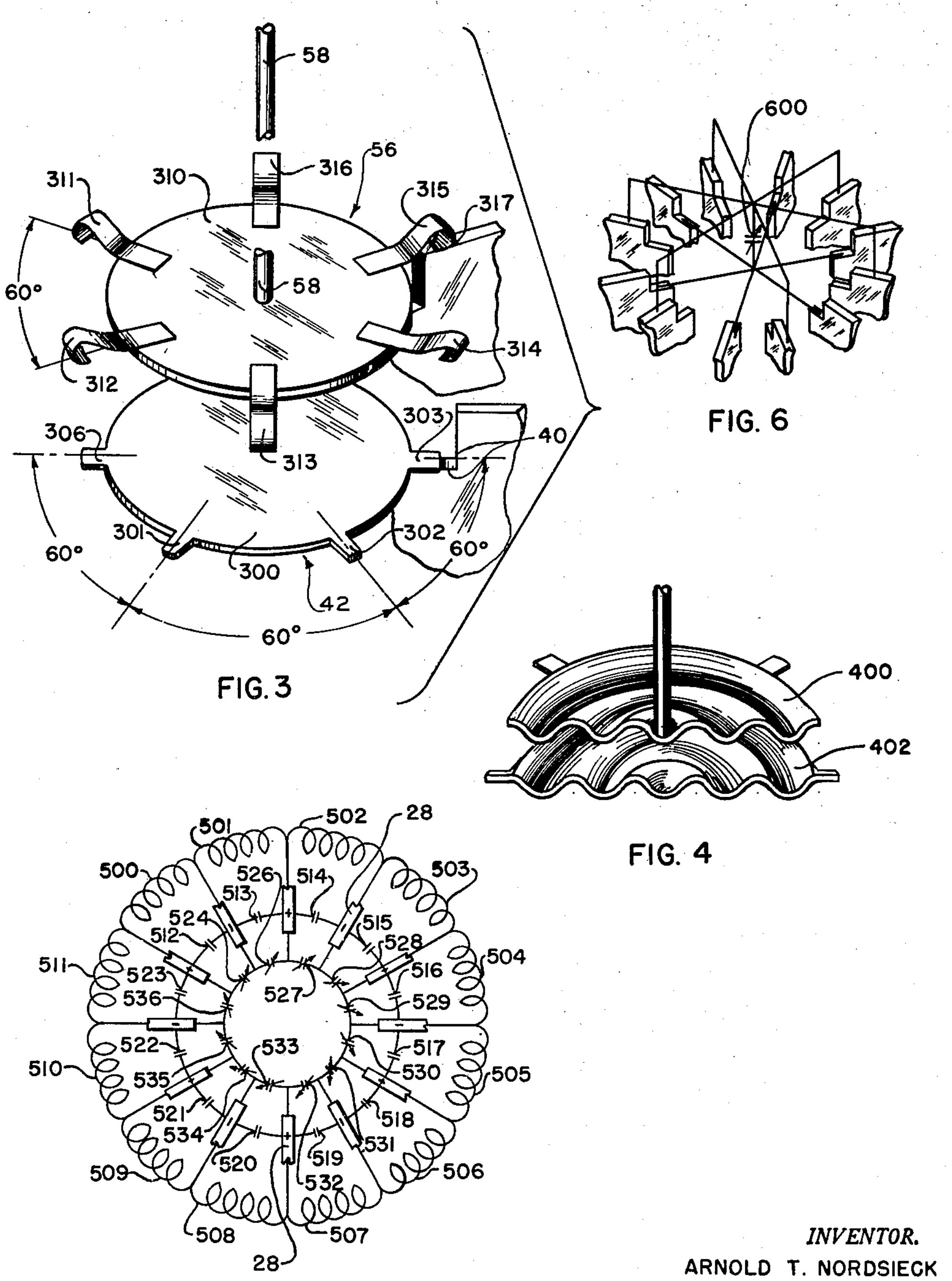
Figure 3 is an exploded perspective view of the tuning discs.
Figure 4 is a cut-away perspective view of a modified version of the tuning discs.
Figures 5 and 6 are explanatory schematic diagrams of the anode resonating circuits.

The upper step 40 of the vanes is used for accommodating a fixed metallic tuning disc 42. The perspective view of this disc is illustrated in Fig. 3. This disc consists of a disc portion 300 and six tabs 301 through 306, tabs 304 and 305 being obscured by disc 56 in Fig. 3, which are used for connecting disc 300 to every other vane of the anode, the tabs resting on the horizontal portions of the upper step 40 of every other vane, as partially illustrated in Figs. 2 and 3.

An adjustable tuning disc 56 is mounted over disc 42; it is rigidly attached to a non-magnetic tuning rod 58, which is connected to a rod holder 59. The rod holder is supported by a threaded stud 60 of the adjusting elements of the tuning mechanism. This mechanism is mounted in a well 61 provided for this purpose in the upper or tuning pole-piece 12. In addition to the elements already described, this mechanism includes a rotatable knurled knob 62, stud 60 being rigidly connected to this knob by a retangularly shaped upper end 63. An elastic vacuum tight connection between the rod holder and the tuning pole-piece 12 is accomplished by means of metallic bellows 64, the upper end of which is soldered to the rod holder, while the lower end is soldered to a circular shoulder provided for this purpose in the tuning pole-piece. The tuning pole-piece is also provided in its lower portion with a narrow central bore 65 which is used for accommodating tuning rod 58. Knob 62 is provided with a ball bearing 66, the racers of which are constructed to resist either an upward or downward thrust exerted upon them by the metallic bellows 64 when they are stretched or compressed. The mechanical axial alignment of the tuning mechanism is accomplished and maintained by the threaded engagement of stud 60 with the inner threaded portion 67 of rod holder 59. In the magnetrons utilizing the axially mounted cathode and two pole-pieces, it is customary to provide two U-shaped magnets for furnishing the necessary permanent magnetic field, a magnet 68 being illustrated in Fig. 1. Each magnet engages two flat surfaces of the pole-pieces which are parallel to the plane of the drawing. The lower portion of the magnet is usually bolted down by bolts 69 and 70 to the base plate of the magnetron while the upper ends of the magnets are connected to each other by bolts 71 and 72, which form a vise-type connection with the tuning pole-piece 12. Shell 18 is provided with a plurality of heat radiators 74, 75, 76, etc., which are partially embedded in the magnetron shell.

Referring to a more detailed description of the adjustable tuning disc 56, its perspective view is illustrated in Fig. 3. This disc consists of a rigid metallic disc portion 310 and a plurality of curled metallic tabs 311 through 316, which are spaced around the circumference of disc 310 at 60° angles so that it is possible to connect them to every other vane of the anode, as illustrated at 317 in Fig. 3. The tabs of one disc are lagging the tabs of the other disc by 30° so that if the lower fixed disc 42 is connected with its tabs to alternate vanes, the upper adjustable disc 56 is connected with its curled flexible tabs 311 through 316 to the remaining vanes. It is this type of connection of the tuning discs that enables them to function not only as a capacitive tuning mechanism of the magnetron, but also as an effective strapping means for the upper end of the anode.

The mechanical and electrical advantages of this type of strapping will be discussed more fully later. At this instant, it should be mentioned that if the wave length of any particular magnetron is sufficiently long for introducing the concentric ring strapping, such may be introduced at the lower end of the anode. In Fig. 1 only one end, namely, the upper end of the anode, is strapped by means of the tuning discs, and because of very effective strapping performed by the discs, the lower end is unstrapped. Generally speaking, the strapping of the lower end of the anode is optional. However, it should be borne in mind that from the point of view of the tuning range, it is preferable to leave the lower end of the anode unstrapped. The reason for this is as follows: Strapping of the lower end introduces additional fixed capacitance into the resonating circuits. It must remain fixed since this capacitance cannot be conveniently connected to rod 58 to make it variable. Therefore, the percentage of tunable capacitance is decreased while the percentage of fixed capacitance is increased. Hence the desirability for avoiding strapping of the lower end of the anode.

The mechanical operation of the disclosed tuning instrumentalities should be apparent from the description given thus far. Suffice it to say that clockwise rotation of knob 62 produces clockwise rotation of the threaded stud 60, which results in the downward travel of rod holder 59, and corresponding compression of metallic bellows 64. This downward travel of rod holder 59 is at once transmitted by rod 58 to disc 56. The resulting decrease in spacing between the discs 42 and 56 increase the capacitance of the condenser, which varies the capacitance of every resonating circuit of the anode. As is well known in the art, the capacity of a plate condenser is proportional to $$\frac{K}{T}$$

where T is the spacing between the plates of the condenser, and K is a constant controlled by the mechanical parameters of condenser. Such variation in capacitance changes the frequency of the operating mode of the anode. This is illustrated in more conventional terms in Figs. 5 and 6.

Referring to Fig. 5, it illustrates twelve resonating circuits of the anode in terms of lumped inductances 500 through 511, and lumped capacitances 512 through 523. The resonance frequency of such circuit is obviously determined by its capacitive and inductive parameters. Although the introduction of the discs 42 and 56 will have some effect on these fixed parameters, the main effect of these discs on these circuits may be represented by variable condensers 524 and 526 through 536 which are connected across the inner tips of the vanes 28. Actually the circuit is of the type illustrated in Fig. 6 where the variable condenser represented by the tuning discs 42 and 56 is illustrated as a single variable condenser 600. However, since this condenser is connected across each pair of adjacent vanes it could also be represented in the manner illustrated in Fig. 5 so long as one remembers that the capacitance of any one variable condenser is equal to the total capacitance 600. The inner tips of adjacent vanes, as illustrated in Fig. 5, have opposite polarities, one of the tips being positive while the next tip is negative. Such distribution of the vane polarities does actually exist when the anode is resonating in the pi-mode, which is usually the mode at which the magnetrons of the disclosed type are operated in practice. Therefore, when the anode is operated at its pi-mode, the variable condensers 524 and 526–536 are each connected across a pair of vanes having opposite polarities. Since the resonance frequency $f_0$ of such circuit is determined in its elementary terms by $$f_0 = \frac{1}{2\pi\sqrt{LC}}$$

where L is the inductance and C is the capacitance of circuit, any change in the capacitance of the condensers 524 and 526–536 will alter the frequency of this mode, and, as stated previously, it also will result in such manner of tuning of the magnetron as to offer a high rate of tuning of the operating mode, which is the pi-mode, in comparison with the tuning rates of the other modes. That this is actually the case follows from the fact that the distribution of the polarities over the inner circumference of the anode for all modes other than the pi-mode will not produce the opposite maximum polarities at the tips of adjacent vanes, and therefore, altering of the capacitance of those condensers which are connected across the vanes having substantially the same, or only slightly different voltage, will have no appreciable effect on the tuning rates of the other modes. Hence, the reason for making the statement that the disclosed tuning system offers a higher rate of tuning of the operating mode as compared with the tuning rates of the other modes.

The behavior of the previously mentioned, known disc or washer type tuning systems is exactly the opposite: there is a low rate of tuning of the operating mode and high rates of tuning of the other modes, since the washer placed on top of symmetrical anode also acts as an effective coupling condenser between more remote vanes than the adjacent vanes. Thus, the known tuning systems favor the wrong modes, which renders them, in some instances, useless from a practical point of view.

There is an additional reason for the disclosed system favoring to a much larger extent the tuning of the pi-mode rather than of any other modes. It may be noted by reference to the Figs. 3, 4, and 6, that a very large capacitance 600, relatively speaking, is connected across the tips of each pair of adjacent segments. The capacitance of this condenser is large as compared to the capacitive parameters of each individual resonating circuit because of large physical dimensions of the condenser plates. These plates are conveniently placed in one of the end spaces of the magnetron, and the anode segments have been imparted the stepped construction, which enables to increase the area of this condenser still further. This large capacitance common condenser is used for tuning all the resonating circuits. What is of especial importance to note is that this condenser is connected in parallel with all resonating circuits so that full capacitance of this condenser is utilized in every resonating circuit. In the previously mentioned known capacitive tuning systems the variable capacitive reactances do not attain the magnitude of the same reactance in the principal case, since in the majority of the cases the tuning circuits resolve themselves into a series connection of a large number of minute condensers, each of these condensers being connected across its own single resonating circuit. It is obvious that with the connections of this type the tuning range, in the main, is limited to the variation in the capacitive reactance of this single small condenser, and, as a consequence, the tuning range of the known capacitive systems inherently is very limited. As stated above this limitation is not one of the inherent characteristics of the disclosed tuning system. Quite on the contrary, the entire end space of the magnetron is used for constructing a large tuning condenser, which is used for tuning every resonating circuit. Hence the reason for making the statement in the objects of the invention that in the disclosed system the fraction of the tunable capacitance is large as compared to the fixed capacitances of the resonating circuits.

It has been stated also in the objects of the invention that the disclosed tuning system also acts as an effective strapping means for the anode structure. This follows from the electrical connections between the discs and the resonating vanes through the tabs. The disclosed method of strapping is more effective electrically, and simpler mechanically, than the known strapping means, which ordinarily comprise two concentric metallic rings, one ring being connected to the tips of the odd resonators, while the other ring is connected to the tips of the even resonators. Generally speaking, the effectiveness of any strapping system depends on the low impedance of each individual strap, and the magnitude of the capacitance between the two straps, the higher being the magnitude of such capacitance, the more effective, or the "tighter," being the electrical coupling between adjacent resonators through the strapping. Comparison of the mechanical features of the disclosed strapping with the most widely used concentric ring type of strapping reveals the fact that the impedance of the disclosed strapping system will be inherently much lower than the impedance of any ring type of strapping, since the currents due to strapping in the disclosed system will flow in the radial direction, along each disc, from the vanes toward the center of the disc. Since such paths will have much larger surfaces, and shorter lengths than in the ring strapping, they also will have correspondingly lower impedances than the paths provided by the rings, which have limited available surface, and considerably longer paths for conducting the ultra high frequency currents. From the point of view of the capacitance of the strapping, the disclosed system will have equally superior characteristics, since large mutually coupled areas of the two discs will exceed the effective areas of the strapping rings by many folds.

Figures 1–3 disclose a tuning system in which the two discs are flat discs connected with their tabs with the respective segments. While the electrical length of the tabs of the fixed discs may be made quite easily very short so as to offer no significant electrical obstacle for the effective strapping of the resonators, the upper adjustable disc must be provided with the tabs which possess sufficient flexibility and length for allowing the adjustment of the upper disc. Although in the majority of cases this problem may be solved without making the tabs of the adjustable discs prohibitively long from the point of view of introduced series impedances, nevertheless, when the length of the flexible straps is deemed to be excessive, the tuning structure may be given somewhat different mechanical configuration to avoid this complication. One such modification is illustrated in Fig. 4 where the two discs 400 and 402 are both corrugated, the corrugations being concentric with the center of the disc and being so spaced with respect to each other that the corrugations of the upper discs mesh with the corrugations in the lower disc when the former is lowered toward the latter. Such arrangement offers an increased capacitance between the discs and thus in effect increases the capacitance 600, and the necessity of using objectionably long connecting tabs for the upper disc is avoided by relying, in the main, on the flexibility of the corrugations. Thus sufficiently large variations in the capacitance of the tuning condenser may be obtained by merely flexing the upper corrugated disc.

The applicability of the disclosed tuning and strapping system to the magnetrons of one centimeter or a fraction of one centimeter band follows from its mechanical construction: the over-all dimensions of the condenser are sufficiently large to permit its use with the smallest anodes now in use.

While the invention has been described with reference to several particular embodiments, it will be understood that various modifications of the apparatus shown may be made within the scope of the following claims.

I claim:

1. An ultra-high frequency magnetron multiresonator anode with a plurality of segments, a variable condenser within said magnetron, one plate of said condenser being connected to only alternate segments of said anode, and the other plate of said condenser being connected only to the remaining segments of said anode, and adjustable means connected to said condenser for moving one of said plates relative to the other to vary the capacitance of said condenser and adjust the frequency of the operating mode of said magnetron.

2. An ultra-high frequency magnetron anode as defined in claim 1 having an end space adjacent to said anode, said variable condenser being mounted in said end space.

3. An ultra-high frequency magnetron anode as defined in claim 1 in which the segments at the tuning end of said anode have stepped construction, and said condenser is a two-plate condenser, one plate of said condenser being mounted on the level of one step, while the other plate is mounted on the level of the next higher step.

4. A tunable magnetron anode with a plurality of cavity resonators, said cavity resonators being defined by a plurality of radially disposed anode segments, a fixed disc coaxially mounted with the axis of said anode, said fixed disc interconnecting only alternate anode segments, and an adjustable disc coaxially mounted in spaced relationship with respect to said first disc, said second disc interconnecting only the remaining resonators, and adjustable means connected to said adjustable disc for varying the spacing between said discs for adjusting the frequency of the operating mode of said resonators.

5. A tunable magnetron anode as defined in claim 4 which further includes flexible tabs connected to said adjustable disc, said tabs interconnecting said adjustable disc with only said remaining elements of said anode.

6. A tunable magnetron anode as defined in claim 4 in which said fixed and adjustable discs are concentrically corrugated discs, the corrugations of one disc meshing into the corrugations of the other disc when said adjustable disc is lowered against said fixed disc.

7. An ultra-high frequency magnetron including a cathode, a multi-resonator anode having a plurality of segments and coaxially mounted with respect to said cathode, first and second pole-pieces mounted in spaced relationship with respect to said anode, first and second metallic discs connected to the circumferential end of said anode, said first disc being connected to only alternate segments of said anode, and said second disc being connected to only the remaining segments of said anode, and adjustable means mounted within said first pole-piece and connected to said second disc, for altering the position of said second disc with respect to said first disc to vary the frequency of the operating mode of said anode in response to the varying positions of said means and of said second disc.

8. A tunable magnetron including a cylindrical cathode, an anode having a plurality of resonating cavities symmetrically disposed with respect to said cathode, said cavities being defined by a corresponding plurality of radially disposed anode segments, said anode segments and said cathode defining an interaction space between said cathode and said anode, one inner corner of each of said anode segments having a stepped construction, a fixed disc mounted in a circumferential recess defined by said stepped construction, means connecting said fixed disc to only alternate anode segments, an adjustable disc coaxially mounted in spaced relationship with respect to said fixed disc through said stepped construction, means flexibly interconnecting said adjustable disc with only the remaining anode segments, and adjustable means connected to said adjustable disc for varying the spacing between said fixed disc and said adjustable disc to vary the operating frequency of said anode.

9. An ultra-high frequency magnetron anode with a plurality of cavity resonators, said cavity resonators being defined by a corresponding plurality of radially disposed anode segments, a variable two-plate condenser connected across said anode elements, one plate of said condenser being connected to only alternate segments, and the other plate of said condenser being connected to only the remaining segments, and adjustable means connected to said condenser for varying the capacitance of said condenser for varying the frequency of the operating mode of said anode by simultaneously and equally altering the capacitive parameters defined by said segments, the connections between the plates of said condenser and said segments constituting a strapping means for said anode.

10. An ultra-high frequency magnetron anode with a plurality of resonating circuits defined by cavity resonators, and a corresponding plurality of anode segments, adjustable strapping and tuning means connected to said segments, said means comprising a two-plate variable condenser, one plate of said condenser being metallically connected to only alternate segments, while the other plate of said condenser is metallically connected to only the remaining segments, the metallic connections between the plates of said condenser and said segments and the plates of said condenser constituting a strapping means for said anode, said condenser being connected in parallel across each of said resonating circuits.

11. A strapped magnetron multi-cavity anode with a plurality of radially disposed anode segments, and two plane parallel discs strapping said segments, one disc being connected to only alternate segments, and the other disc being connected to only the remaining segments, said discs being coaxially mounted with the axis of said anode.

ARNOLD T. NORDSIECK.

References Cited in the file of this patent

UNITED STATES PATENTS

| Number | Name | Date |
|---|---|---|
| 2,408,237 | Spencer | Sept. 24, 1946 |
| 2,408,903 | Biggs et al. | Oct. 8, 1946 |
| 2,414,084 | Bowen | Jan. 14, 1947 |
| 2,414,085 | Hartman | Jan. 14, 1947 |
| 2,424,496 | Nelson | July 22, 1947 |
| 2,444,435 | Fisk | July 6, 1948 |
| 2,481,171 | Spencer | Sept. 6, 1949 |
| 2,482,541 | Hall et al. | Sept. 20, 1949 |
| 2,505,529 | Crawford et al. | Apr. 25, 1950 |